United States Patent [19]
Scovell et al.

[11] Patent Number: 4,745,080
[45] Date of Patent: May 17, 1988

[54] METHOD OF MAKING A SELF-ALIGNED BIPOLAR TRANSISTOR WITH COMPOSITE MASKING

[75] Inventors: Peter D. Scovell, Chelmsford; Peter F. Blomley, Bishops Stortford; Roger L. Baker, Chelmsford; Gary J. Tomkins, Maidstone, all of Great Britain

[73] Assignee: STC, plc, England

[21] Appl. No.: 831,257

[22] Filed: Feb. 20, 1986

[30] Foreign Application Priority Data
Mar. 23, 1985 [GB] United Kingdom ............... 8507602

[51] Int. Cl.⁴ .................... B01J 17/00; H01L 21/26; H01L 21/225
[52] U.S. Cl. ................................ 437/31; 437/50; 437/147; 437/158; 437/979; 437/984; 437/962; 437/924; 357/34; 357/546 H; 357/59 K; 357/59; 148/102; 148/106; 148/116; 148/124
[58] Field of Search ............... 29/571, 576 B, 576 W, 29/578, 579, 591; 148/1.5, 187, DIG. 10, DIG. 11, DIG. 30, DIG. 76, DIG. 83, DIG. 84, DIG. 116, DIG. 24, DIG. 141; 357/34, 15, 23.9, 48, 56, 59

[56] References Cited

U.S. PATENT DOCUMENTS

| | | | |
|---|---|---|---|
| 3,481,030 | 12/1969 | Te Velde et al. | 29/571 |
| 4,188,707 | 2/1980 | Asano et al. | 29/571 |
| 4,240,195 | 12/1980 | Clemens et al. | 29/571 |
| 4,377,903 | 3/1983 | Kanzaki et al. | 29/577 C |
| 4,486,766 | 12/1984 | Shannon | 357/15 |
| 4,503,603 | 3/1985 | Blossfeld | 29/571 |
| 4,509,250 | 4/1985 | Blossfeld | 29/578 |
| 4,531,282 | 7/1985 | Sakai et al. | 29/578 |
| 4,550,490 | 11/1985 | Blossfeld | 29/571 |
| 4,554,729 | 11/1985 | Tanimura et al. | 29/577 C |

FOREIGN PATENT DOCUMENTS
0123157 9/1980 Japan ................... 357/51

Primary Examiner—Brian E. Hearn
Assistant Examiner—William Bunch
Attorney, Agent, or Firm—Kerkam, Stowell, Kondracki & Clarke

[57] ABSTRACT

A fully self-aligned polycrystalline silicon emitter bipolar transistor. Self-alignment of the p+ base contact (12) is achieved by using oxidized sidewalls (8) (sidewall spacers) of the emitter mesa (7) as part of the p+ base contact implantation mask. Collector contact (13) alignment can be achieved using oxidized sidewalls (17) of polycrystalline silicon alignment mesas (14) defined in the same polysilicon as the emitter mesa (7) but deposited on oxide (2) rather than the implanted base region (5).

7 Claims, 1 Drawing Sheet

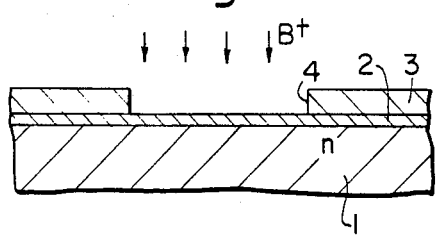
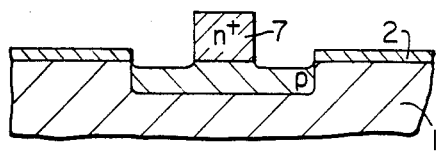
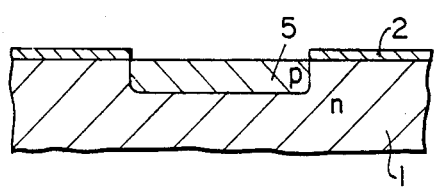
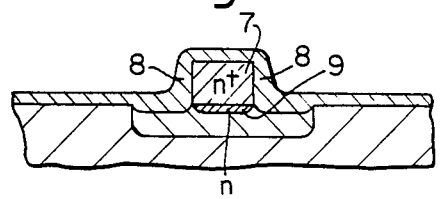
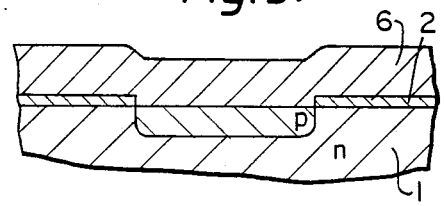
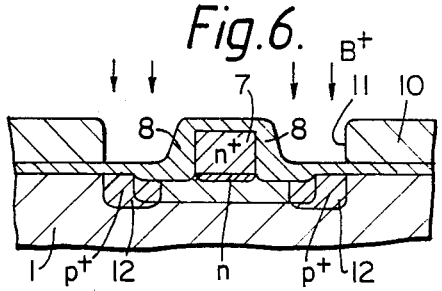
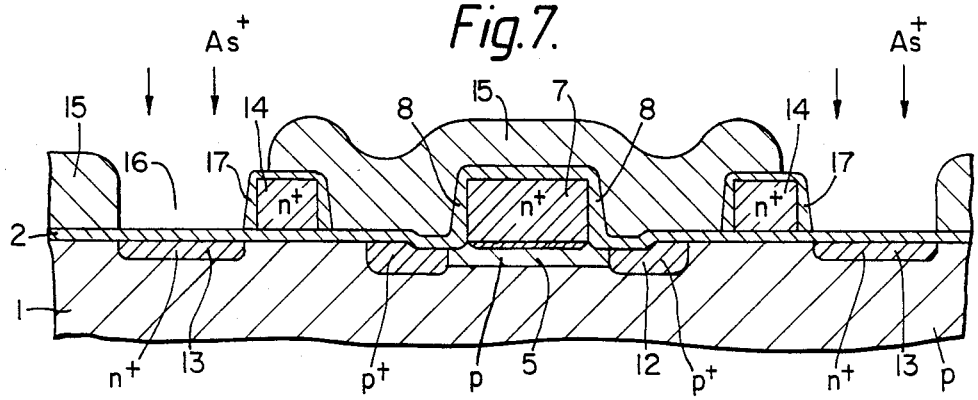

METHOD OF MAKING A SELF-ALIGNED BIPOLAR TRANSISTOR WITH COMPOSITE MASKING

This invention relates to semiconductor devices and in particular bipolar transistors with polycrystalline silicon emitters, and methods of manufacturing them.

The use of a polycrystalline silicon emitter offers improved performance for bipolar transistors. Several methods of self-aligning this type of device have been published, for example Tang D., IEEE JSSC SC17 1983 p. 226 and Sakai T., IEEE EIDM Techn. Drg. 1983 p. 16. These methods rely on the use of polysilicon (polycrystalline silicon) base contacts and therefore two layers of polysilicion are required.

According to one aspect of the present invention there is provided a method of manufacturing a bipolar transistor including the steps of defining a polycrystalline silicon emitter mesa on an unoxidised surface of a base region disposed in a semiconductor substrate, oxidising side walls of the mesa and the exposed unoxidised surface of the base region, and implanting a base contact region into the substrate in contact with the base region using at least one oxidised side wall of the mesa as part of the implantation mask whereby the base contact region is self-aligned with the emitter.

According to another aspect of the present invention there is provided a bipolar transistor including a polycrystalline silicon emitter mesa in contact with a base region and including a base contact, the emitter having an oxidised sidewall which during manufacture of the transistor serves for self-alignment of the base contact.

Embodiments of the present invention will now be described with reference to the accompanying drawings, in which:

FIGS. 1 to 6 illustrate, schematically and in cross-section, successive processing stages in the manufacture of self-aligned base contacts according to one embodiment of the present invention, and FIG. 7 illustrates a cross-section through a fully self-aligned polysilicon emitter bipolar transistor.

Referring firstly to FIGS. 1 to 6 the successive processing stages required to manufacture self-aligned base contacts will be described. A substrate 1 of n-type single crystal silicon is oxidised to provide a surface layer of silicon dioxide 2. A layer of photoresist 3 is applied and using a suitable mask (not shown) a window 4 is opened in the photoresist 3, which window 4 defines the base area (FIG. 1). Using ion implantation boron, for example, is implanted to produce a base 5. Following this implantation the oxide exposed through window 4 is etched using the base mask (photoresist 3) to define the area within which the emitter will be formed. The photoresist 3 is removed (FIG. 2). If a surface treatment is required to produce an interfacial oxide it can be used now. A layer of polysilicon 6 is then deposited (FIG. 3) and doped n+, for example with arsenic or phosphorus. Following definition of the emitter area the polysilicon 6 is dry etched to produce the structure of FIG. 4 with a substantially central n+ polysilicon mesa or emitter 7. The dry etch is controlled to give good anisotropy and high selectivity over the single crystal silicon substrate 1. We have demonstrated a selectivity of 10:1. For typical layer thickness and overetches this would lead to less than 500 A (0.05 μm) of the base being consumed during the polysilicon etch process. The structure is then provided with oxide sidewall spacers 8 (FIG. 5).

The spacers may be produced by, for example the oxidation method described in our co-pending British Application No. 8507600 (published under Ser. No. 2172743) (P. D. Scovell-R. L. Baker 14-6) or by using reactive ion etching (RIE) of a conformed deposited oxide. The method described in our co-pending application involves the use of a silicon nitride capping layer on a polysilicon mesa (emitter) and oxidising the sidewalls of the mesa at a low temperature which is preferably below 900° C. in order to take full advantage of the differential oxidation ratio of polysilicon and single crystal silicon. As a result of this processing a n type region 9 is formed. The structure is then provided with a photoresist layer 10 (FIG. 6) which is patterned using a suitable mask (not shown) to provide a window 11 therein, that is to define a p+ contact mask. A base contact implant of, for example, boron is performed to produce base contacts 12 which are self-aligned with the polysilicon emitter region 7 by virtue of using the polysilicon and sidewall spacers 8 as a part of the p+ contact mask. To complete a bipolar transistor from the structure of FIG. 6 a collector contact (not shown) to the substrate 1 is required together with suitable metallisation, for example, to provide external electrical contacts to the base and collector contacts and to the polysilicon emitter.

A section through a complete bipolar transistor is shown in FIG. 7. This transistor has collector contacts 13 which are aligned to the emitter edges by use of polysilicon stripes (alignment mesas) 14 defined in the same masking and etching sequence as the emitter mesa 7. The sidewalls 17 of the stripes 14 are also oxidised as those of the emitter 7. A photoresist layer 15 is applied and patterned using a mask not shown to provide windows 16 for implantation of arsenic, for example, for the collector contacts 13. The mask need only be a "sloppy" mask since the outermost oxidised edges of the stripes 14 define the edge of the collector contacts and photoresist is only required to protect areas into which collector contact material is not to be implanted. The edge of the polysilicon stripe defines the distance between the emitter edge and the collector contact. The device is fully self-aligned since the base contacts are self-aligned with the emitter edge, that is the emitter edge is spaced a defined distance from the base contact edge, and the collector contacts are self-aligned, that is the collector contact edge is spaced a defined distance from the emitter edge.

The self-alignment of the base contacts is thus achieved by a method which uses a single layer of polysilicon and sidewalls and is simplified in comparison with the method using two layers of polysilicon as required in the known methods referred to above.

What is claimed is:

1. A method of manufacturing a bipolar transistor including the steps of defining a polycrystalline silicon emitter mesa on an unoxidized surface of a base region disposed in a semiconductor substrate, oxidizing side walls of the emitter mesa and the exposed unoxidized surface of the base region, providing a photoresist layer over the emitter mesa including the oxidized side wall thereof, over the oxidized surface of the base region and over adjoining surface regions of the semiconductor substrate, patterning the photoresist layer to define one part of a two part base contact implantation mask, the other part of the mask being comprised by at least one oxidized side wall of the emitter mesa, and to remove the photoresist layer from the at least one oxidized side wall between which mask parts is defined a window for base contact region implantation, subsequently implanting a base contact region into the substrate the majority of which lies outside but in contact with the base region through said window, the base contact region being self-aligned with the emitter mesa as a result of using said at least one oxidized side wall of the emitter mesa directly as part of the base contact implantation photoresist layer.

2. A method as claimed in claim 1, wherein the base region is implanted into the substrate through an oxide layer disposed thereon via a window in a masking layer and wherein the oxide layer exposed by the window is subsequently removed.

3. A method as claimed in claim 2, wherein the emitter mesa is defined from a layer of polycrystalline silicon deposited on the substrate subsequent to the removal of the oxide layer exposed by the window.

4. A method as claimed in claim 3, wherein the emitter mesa definition comprises appropriately masking the polycrystalline silicon layer and dry etching.

5. A method as claimed in claim 3 further including the steps of defining a polycrystalline silicon collector contact alignment mesa from said layer of polycrystalline silicon simultaneously with said polycrystalline silicon emitter mesa, which alignment mesa is disposed on the oxide layer and whose sole useful purpose in the transistor is for spacing definition, the side walls of which alignment mesa are oxidized during said oxidizing step and said photoresist layer also being disposed over the alignment mesa during said base contact implantation; providing a further photoresist layer over the emitter mesa including the oxidizing side walls thereof, over the oxidized surface of the base region, over the alignment mesa including the oxidized side walls thereof and over adjoining surface regions of the semiconductor substrate on which the oxide layer is disposed; patterning the further photoresist layer to define one part of a two part collector contact implantation mask, the other part of the collector contact implantation mask being comprised by at least one oxidized side wall of the alignment mesa and to remove the further photoresist layer from the at least one oxidized side wall of the alignment mesa between which collector contact implantation mask parts is defined a window for collector contact implantation; subsequently implanting a collector contact region into the substrate through said collector contact implantation window, the spacing between the emitter mesa and the collector contact region being defined by the spacing between the emitter mesa and the aligned mesa, the patterned further photoresist layer serving also to prevent implantation of collector contact material into areas other than the collector contact region; and removing the patterned further photoresist layer.

6. A method as claimed in claim 4 further including the steps of defining a polycrystalline silicon collector contact alignment mesa from said layer of polycrystalline silicon simultaneously with said polycrystalline silicon emitter mesa, which alignment mesa is disposed on the oxide layer and whose sole useful purpose is for spacing definition, the side walls of which alignment mesa are oxidized during said oxidizing step and said photoresist layer also being disposed over the alignment mesa during said base contact implantation; providing a further photoresist layer over the emitter mesa including the oxidized side walls thereof, over the oxidized surface of the base region, over the alignment mesa including the oxidized side wall thereof and over adjoining surface regions of the semiconductor substrate on which the oxide layer is disposed; patterning the further photoresist layer to define one part of a two part collector contact implantation mask, the other part of the collector contact implantation mask being comprised by at least one oxidized side wall of the alignment mesa, and to remove the further photoresist layer from the at least one oxidized side wall of the alignment mesa, between which collector contact implantation mask parts is defined a window for collector contact implantation; subsequently implanting a collector contact region into the substrate through said collector contact implantation window, the spacing between the emitter mesa and the collector contact region being defined by the spacing between the emitter mesa and the alignment mesa, the patterned further photoresist layer serving also to prevent implantation of collector contact material into areas other than the collector contact region; and removing the patterned further photoresist layer.

7. A method of manufacturing a bipolar transistor including the steps of providing a semiconductor substrate having an oxide layer on a surface thereof, a region of which semiconductor substrate comprises the collector of the bipolar transistor; providing a base region within the collector region, the oxide layer being removed at the base region and the base region having a surface which is substantially unoxidized; depositing a layer of polycrystalline silicon to cover said oxide layer and the base region; defining a polycrystalline silicon emitter mesa from said polycrystalline silicon layer on the substantially unoxidized surface of the base region, the entire surface of the emitter mesa facing the base region being in contact therewith, and simultaneously defining a polycrystalline silicon collector contact alignment mesa from said polycrystalline layer on the oxide layer, the sole useful purpose of the alignment mesa in the transistor being for spacing definition; oxidizing the side walls of the emitter and alignment mesas and the exposed surface of the base region; providing a first photoresist layer over the emitter mesa including the oxidized side walls thereof, over the oxidized surface of the base region, the alignment mesa including the oxidized side walls thereof and over adjoining surface regions of the semiconductor substrate on which the oxide layer is disposed; patterning the first photoresist layer to define one part of a two-part base contact implantation mask, the other part of the base contact implantation mask being comprised by at least one oxidized side wall of the emitter mesa, and to remove the first photoresist layer from the at least one oxidized side wall of the emitter mesa between which mask part is defined a first window for base contact region implantation; subsequently implanting, in a first implantation step, a base contract region in contact with the base region through the first window, the base contact region being self-aligned with the emitter mesa as a result of using said at least one oxidized side wall of the emitter mesa directly as part of the respective mask, removing the patterned first photoresist layer; providing a second photoresist layer over the emitter mesa including the oxidized walls thereof, over the oxidized surface of the base region, over the alignment mesa including the oxidized side walls thereof and over adjoining surface regions of the semi conductor substrate on which the oxide layer is disposed; patterning the second photoresist layer to define one part of a two-part collector contact region implantation mask, the other part of the collector contact region implantation mask being comprised by at least one oxidized side wall of the alignment mesa, and to remove the further photoresist layer from the at least one oxidized side wall of the alignment mesa, between which collector contact region implantation mask parts is defined a second window for collector contact region implantation; subsequently implanting, in a second implantation step, a collector contact region through the second window, the spacing between the emitter mesa and the collector contact region being defined by the spacing between the emitter mesa and the alignment mesa, the patterned second photoresist layer serving also to prevent implantation of collector contact material into areas other than the collector contact region; and removing the patterned second photoresist layer.

* * * * *